(12) United States Patent
Ayotte et al.

(10) Patent No.: US 8,829,674 B2
(45) Date of Patent: Sep. 9, 2014

(54) STACKED MULTI-CHIP PACKAGE AND METHOD OF MAKING SAME

(71) Applicant: International Business Machines Corporation, Armonk, NY (US)

(72) Inventors: Stephen P. Ayotte, Bristol, VT (US); David J. Hill, Richmond, VT (US); Timothy M. Sullivan, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 13/732,480

(22) Filed: Jan. 2, 2013

(65) Prior Publication Data
US 2014/0183723 A1    Jul. 3, 2014

(51) Int. Cl.
*H01L 29/40*    (2006.01)
*H01L 23/00*    (2006.01)

(52) U.S. Cl.
CPC ............... *H01L 24/81* (2013.01); *H01L 24/17* (2013.01)
USPC ........................................................ 257/737

(58) Field of Classification Search
CPC ............................... H01L 24/14; H01L 24/28
USPC ........................................................ 257/737
See application file for complete search history.

(56) References Cited

U.S. PATENT DOCUMENTS

| | | | |
|---|---|---|---|
| 6,380,494 B1 | 4/2002 | Mays et al. | |
| 7,952,205 B2 | 5/2011 | Belanger et al. | |
| 2006/0071314 A1 | 4/2006 | Ho et al. | |
| 2009/0155981 A1* | 6/2009 | Ayotte et al. | 438/462 |
| 2009/0279275 A1* | 11/2009 | Ayotte et al. | 361/808 |
| 2010/0140783 A1* | 6/2010 | Do et al. | 257/692 |

* cited by examiner

*Primary Examiner* — Thao X Le
*Assistant Examiner* — Patricia Reddington
(74) *Attorney, Agent, or Firm* — Schmeiser, Olsen & Watts; Anthony Canale (57) ABSTRACT

Stacked multichip packages and methods of making multichip packages. A method includes using a boat having different depth openings corresponding to the length of column interconnections of the completed multichip package and masks to place proper length columns in the corresponding depth openings; placing an integrated circuit chip on the boat and attaching exposed upper ends of the columns to respective chip pads of the integrated circuit using a first solder reflow process and attaching a preformed package substrate integrated circuit chip stack to the integrated circuit and attached columns using a second solder reflow process.

12 Claims, 9 Drawing Sheets

STACKED MULTI-CHIP PACKAGE AND METHOD OF MAKING SAME

TECHNICAL FIELD

The present invention relates to the field of integrated circuit chip packages; more specifically, it relates to stacked integrated circuit chip packages.

BACKGROUND

Integrated circuit chip stacking is a technology that allows for a high density form factor by stacking integrated circuit chips on top of each other. However, a problem with current stacked integrated circuit chip packages is signals from the first integrated circuit chips have to travel through all the second integrated circuit chips to get to the package substrate causing delay, loss, and noise in the signals. Accordingly, there exists a need in the art to eliminate the deficiencies and limitations described hereinabove.

BRIEF SUMMARY

A first aspect of the present invention is a method, comprising: providing a boat having first openings extending a first depth into the boat and second openings extending a second and different depth into the boat; placing a first mask on the boat, first through openings of the first mask aligned to the first openings, the first mask blocking the second openings and then placing first columns into the first openings through the first through openings followed by removing the first mask; placing a second mask on the boat, second through openings of the second mask aligned to the second openings, the second mask blocking the first openings and then placing second columns into the second openings through the second through openings followed by removing the second mask; and placing an integrated circuit chip on the boat and attaching exposed upper ends of the first and second columns to respective chip pads of the integrated circuit using a solder reflow process and then removing the boat.

A second aspect of the present invention is a stacked multichip package, comprising: a package substrate; a first integrated circuit chip physically and electrically connected to the package substrate by first solder bumps; a second integrated circuit chip physically and electrically connected to the first integrated circuit by second solder bumps; and a third integrated circuit chip physically and electrically connected to first integrated circuit by first columns and physically and electrically connected to second integrated circuit by second columns.

A third aspect of the present invention is a stacked multichip package, comprising: a package substrate; a first integrated circuit chip physically and electrically connected to the package substrate by first solder bumps; a second integrated circuit chip physically and electrically connected to the first integrated circuit by second solder bumps; and a third integrated circuit chip physically and electrically connected to first integrated circuit by first columns, physically and electrically connected to second integrated circuit by second columns, and physically and electrically connected to second integrated circuit by third solder bumps.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIGS. 5A through 5L illustrate an exemplary method of fabricating a stacked integrated circuit chip package according to an embodiment of the present invention.

DETAILED DESCRIPTION

The embodiments of the present invention provide for a stacked integrated circuit chip package (hereinafter "stacked chip package" that sends a first group of signals from an first integrated circuit chip to a package substrate through an intervening integrated circuit chip having through wafer vias and sends a second group of signals from the first integrated circuit chip to the package substrate directly or indirectly through electrically conductive columns external to the integrated circuit chips.

An integrated circuit chip is an electronic circuit manufactured by lithography, etching and the patterned diffusion of trace elements into the surface of a thin substrate of semiconductor material to form active and passive devices. Integrated circuits contain transistors (e.g., NFETs and PFETs), resistors and capacitors. Additional integrated circuits contain patterned electrically conductive interconnections (e.g., wires) that connect the devices into functional circuits. By contrast, most package substrates contain only interconnections and sometimes decoupling capacitors.

The terms "connect" and "connected" are defined as meaning "electrically and physically connect" and "electrically and physically connected" respectively unless otherwise indicated. The term "directly" when used in reference to a signal path is defined to mean the signal path "not passing through an intervening integrated circuit chip." Signal paths are electrically conductive physical entities and may be unidirectional or bidirectional. Signal paths may, for example, carry data signals, clock signals or power or ground.

Figure 1:
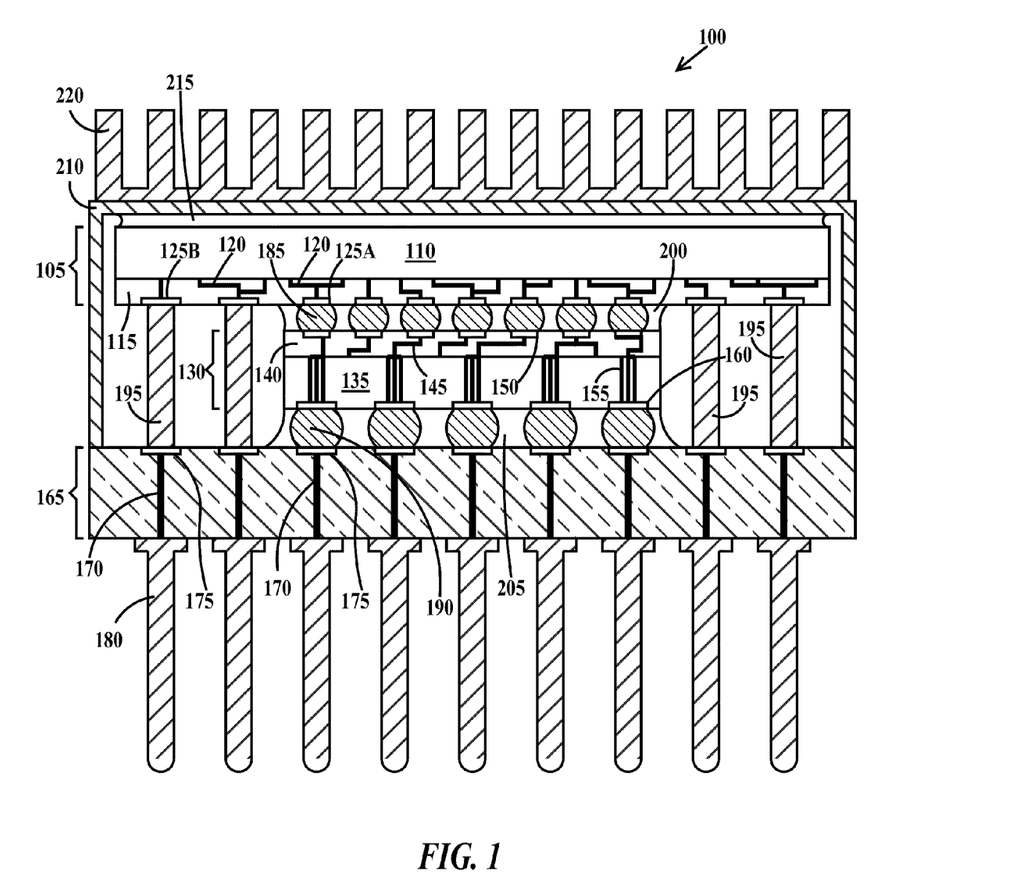
FIG. 1 is a cross-sectional view through a first exemplary stacked integrated circuit chip package according to the present invention.

FIG. 1 is a cross-sectional view through a first exemplary stacked integrated circuit chip package according to the present invention. In FIG. 1, a stacked chip package 100 includes an first integrated circuit chip 105 comprising a semiconductor (e.g., silicon) substrate 110 and a set of wiring levels 115 containing electrically conductive wires 120 (in interlevel dielectric layers) that connect devices (e.g., transistors) in substrate 110 to chip pads 125A and 125B. Stacked chip package 100 further includes a second integrated circuit chip 130 comprising a semiconductor (e.g., silicon) substrate 135 and a set of wiring levels 140 containing electrically conductive wires 145 (in interlevel dielectric layers) that connect devices (e.g., transistors) in substrate 135 to chip pads 150. Integrated circuit chip 130 further includes electrically conductive through wafer vias 155 (that are electrically isolated from semiconductor substrate 135) that connect wires 145 to backside chip pads 160. Stacked chip package 100 further includes a dielectric package substrate 165 having electrically conductive wires 170 connecting substrate pads 175 to electrically conductive pins 180. In one example, package substrate 165 is an organic substrate (e.g., printed circuit board). In one example, package substrate 165 is a ceramic substrate. Package substrate 165 may contain multiple wiring levels. While stacked chip package 100 is illustrated in a pin grid array format, other formats such as BGA or solder column array may be substituted.

Chip pads 125A of first integrated circuit chip 105 are connected to chip pads 150 of second integrated circuit chip 130 by solder bumps 185. Solder bumps are also known as C4s (controlled chip collapse connections). Backside chip pads 160 of second integrated circuit chip 130 are connected to a subset of package substrate pads 175 of package substrate 165 by solder bumps 190. Chip pads 125B of first integrated circuit chip 105 are connected to a different subset of package substrate pads 175 of package substrate 165 by columns 195.

Optionally, an underfill 200 is formed between first integrated circuit chip 105 and second integrated circuit chip 130. In one example, underfill 200 comprises silica filled epoxy resin. Optionally, an underfill 205 is formed between second integrated circuit chip 130 and package substrate 165. In one example, underfill 205 comprises silica filled epoxy resin. Stacked chip package 100 may include a lid 210. An optional thermal grease 215 may be formed between the backside of first integrated circuit chip 105 and lid 210. An optional heat sink 220 may be attached to lid 210. In one example, columns 195 are solder columns. In one example, columns 195 are copper posts which are soldered to package substrate pads 175. Alternatively, in one example, solder bumps 190 are replaced with ball grid array (BGA) connections which comprise copper balls soldered to backside chip pads 160 and package substrate pads 175. When columns 195 are solder columns, columns 195 may comprise Sn/Bi, Sn/Pd or Sn/Ag. In one example, when columns 195 are solder columns, the columns reflow (melt) at a temperature below about 260° C. In one example solder bumps 185 and 190 are 97% Pb and 3% Sn. In one example solder bumps 185 and 190 reflow at a temperature above about 260° C.

Figure 2:
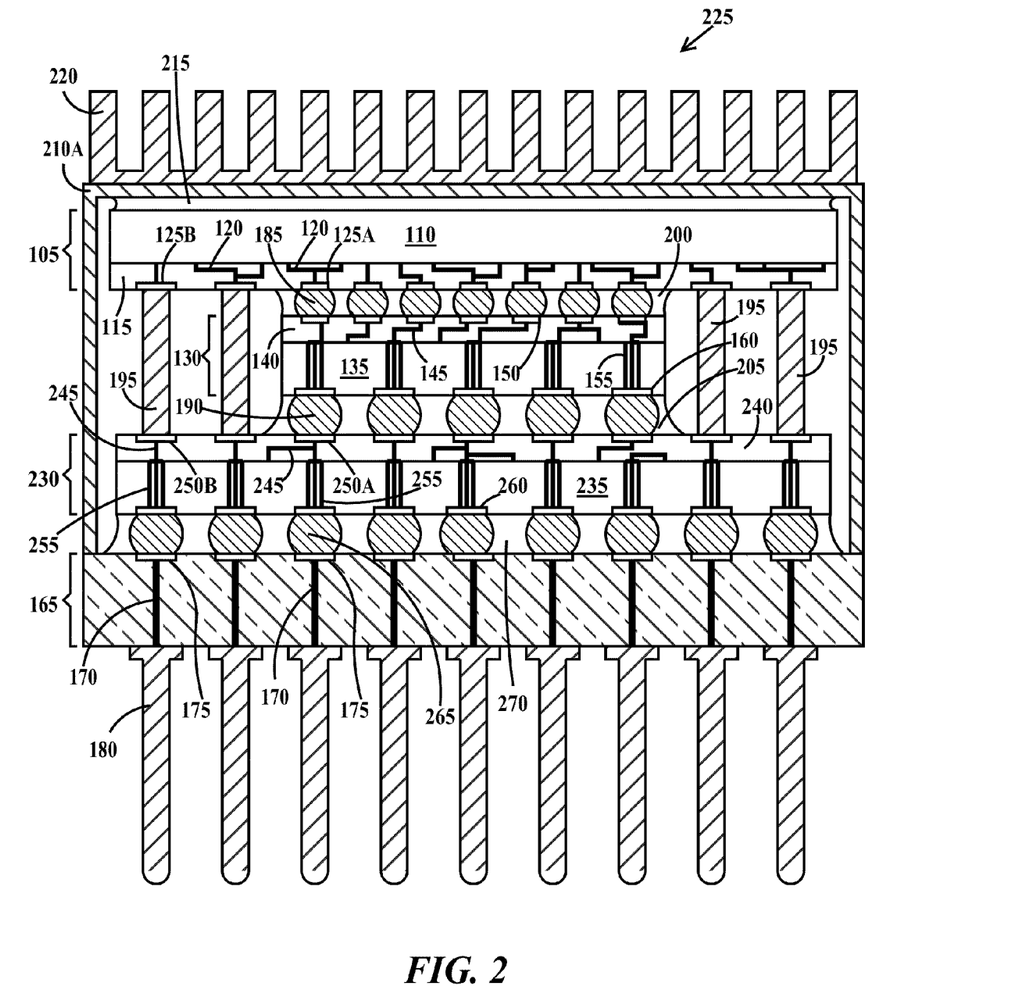
FIG. 2 is a cross-sectional view through a second exemplary stacked integrated circuit chip package according to the present invention.

FIG. 2 is a cross-sectional view through a second exemplary stacked integrated circuit chip package according to the present invention. In FIG. 2, a stacked chip package 225 is similar to stacked chip package 100 of FIG. 1 but with the following differences: Stacked chip package 225 includes a third integrated circuit chip 230 comprising a semiconductor substrate 235 and a set of wiring levels 240 containing electrically conductive wires 240 (in interlevel dielectric layers) that connect devices (e.g., transistors) in substrate 235 to chip pads 250A and 250B. Integrated circuit chip 230 further includes electrically conductive through wafer vias 255 (that are electrically isolated from semiconductor substrate 235) that connect wires 245 to backside chip pads 260. Backside chip pads 160 of second integrated circuit chip 130 are connected to chip pads 250A of third integrated circuit chip 230 by solder bumps 190. Columns 195 connect chip pads 125B of first integrated circuit chip 105 to chip pads 250B of third integrated circuit chip 230. Finally, underfill 205 is formed between first integrated circuit chip 130 and second integrated circuit chip 230 and an underfill 270 is formed between integrated circuit chip 230 and package substrate 165.

Figure 3:
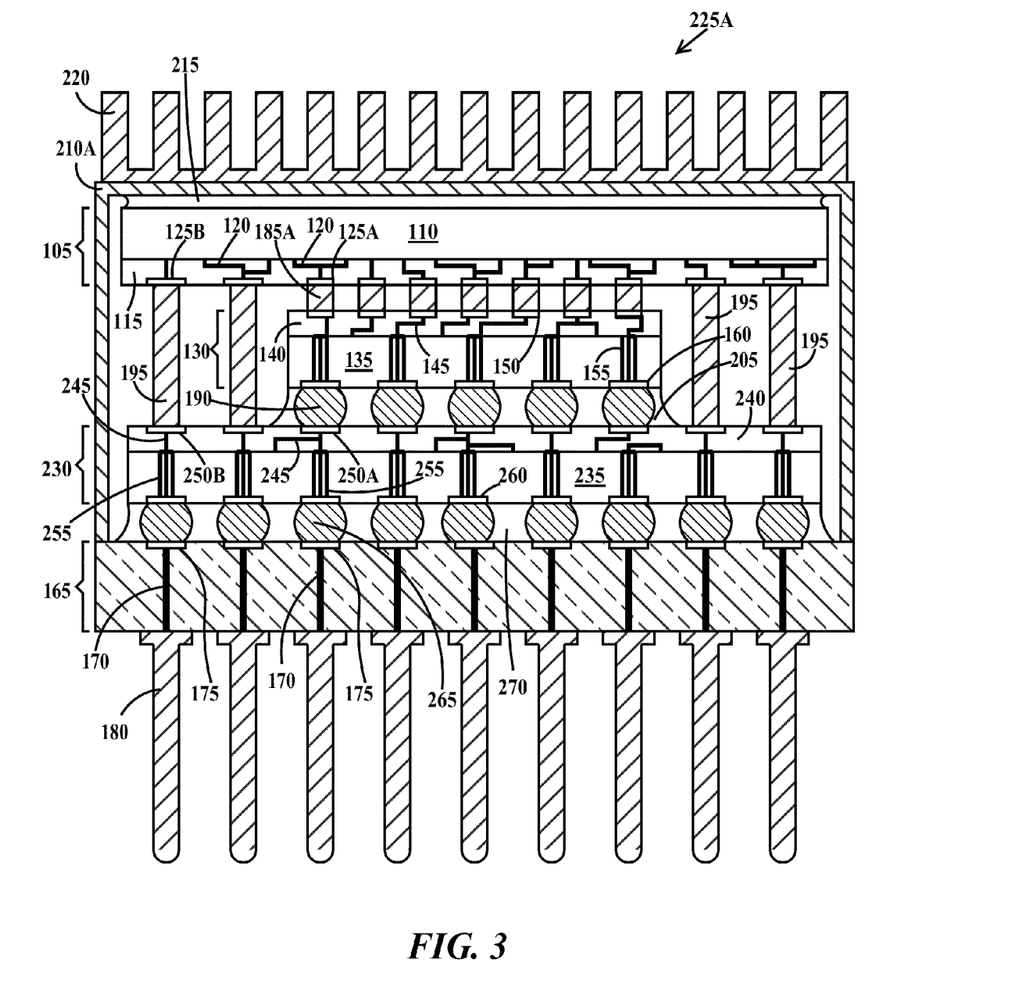
FIG. 3 is a cross-sectional view through a third exemplary stacked integrated circuit chip package according to the present invention.

FIG. 3 is a cross-sectional view through a third exemplary stacked integrated circuit chip package according to the present invention. In FIG. 3, a stacked chip package 225A is similar to stacked chip package 225 of FIG. 2 except solder bumps 185 of FIG. 2 are replaced with columns (solder or copper) 185A, And while there is no underfill between first integrated circuit chip 105 and second integrated circuit chip 130 as shown in FIG. 1 (see FIG. 2, underfill 200) there may be an underfill formed between first integrated circuit chip 105 and second integrated circuit chip 130.

Figure 4:
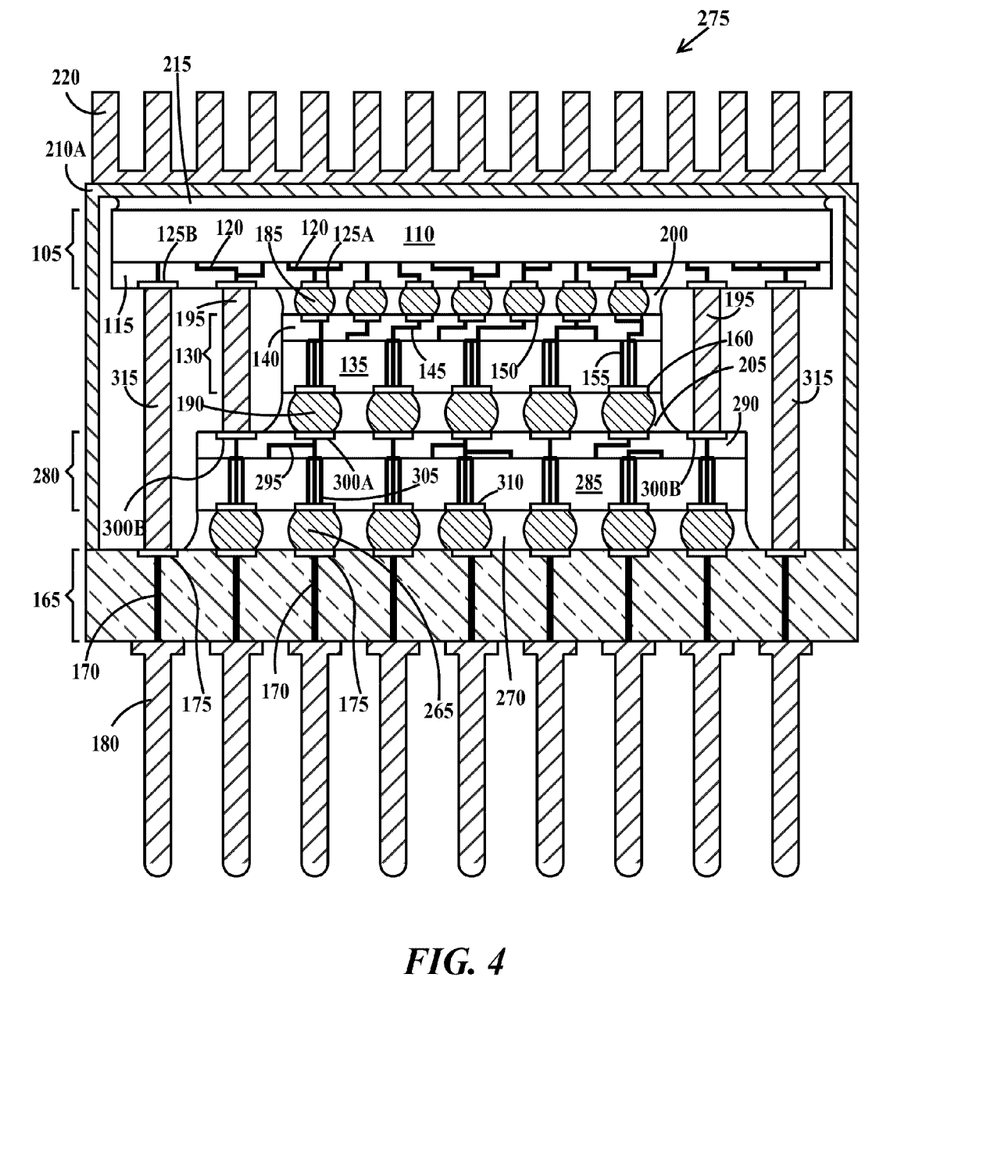
FIG. 4 is a cross-sectional view through a fourth exemplary stacked integrated circuit chip package according to the present invention.

FIG. 4 is a cross-sectional view through a fourth exemplary stacked integrated circuit chip package according to the present invention. In FIG. 4, a stacked chip package 275 is similar to stacked chip package 225 of FIG. 2 but with the following differences: An integrated circuit chip 280 replaces integrated circuit chip 230 of FIG. 2 as the third integrated circuit chip. Integrated circuit chip 280 comprises a semiconductor (e.g., silicon) substrate 285 and a set of wiring levels 290 containing electrically conductive wires 295 (in interlevel dielectric layers) that connect devices (e.g., transistors) in substrate 295 to chip pads 300A and 300B. Integrated circuit chip 280 further includes electrically conductive through wafer vias 305 (that are electrically isolated from semiconductor substrate 285) that connect wires 295 to backside chip pads 310. While in chip package 225 of FIG. 2, there were only columns 195 and all columns 195 were connected to chip pads 250B, in chip package 275, some columns are columns 195 and are connected to chip pads 300B and some columns are columns 315 that are connected a subset of package substrate pads 175 that are different from the subset of package substrate pads 175 connected to solder bumps 265.

Returning to FIG. 1, in stacked chip package 100 of FIG. 1, first integrated circuit chip 105 is connected to second integrated circuit chip 130 by solder bumps 185, first integrated circuit chip 105 is connected to package substrate 165 by columns 195 and second integrated circuit 130 is connected to package substrate 165 by solder bumps 190. This allows four possible signal paths: A first signal path is between first integrated circuit chip 105 and pins 180 through second integrated circuit chip 130, a second signal path is directly between first integrated circuit 130 and pins 180 through columns 195, a third signal path is directly between second integrated circuit chip 130 and pins 180 and a fourth signal path is directly between first integrated circuit 105 and second integrated circuit 130.

Returning to FIG. 2, in stacked chip package 225 of FIG. 2, first integrated circuit chip 105 is connected to second integrated circuit chip 130 by solder bumps 185, first integrated circuit chip 105 is connected to third integrated circuit chip 230 by columns 195, second integrated circuit chip 130 is connected to third integrated circuit chip 230 by solder bumps 190 and third integrated circuit 230 is connected to package substrate 165 by solder bumps 265. This allows eight possible signal paths: A first signal path is between first integrated circuit chip 105 and pins 180 through second integrated circuit chip 130 and third integrated circuit chip 230, a second signal path is between first integrated circuit 105 and pins 180 through columns 195 and third integrated circuit chip 230, a third signal path is between second integrated circuit chip 130 and pins 180 through third integrated circuit chip 230, a fourth signal path is between first integrated circuit 105 and third integrated circuit 230 through columns 195, a fifth signal path is directly between first integrated circuit chip 105 and pins 180, a sixth signal path is directly between first integrated circuit chip 105 and second integrated circuit chip 130, a seventh signal path is directly between second integrated circuit chip 130 and third integrated circuit chip 230, and an eighth signal path is between first integrated circuit chip 105 and third integrated circuit 230 through second integrated circuit 130.

Returning to FIG. 3, in stacked chip package 225A of FIG. 3, first integrated circuit chip 105 is connected to second integrated circuit chip 130 by columns 185A, first integrated circuit chip 105 is connected to third integrated circuit chip 230 by columns 195, second integrated circuit chip 130 is connected to third integrated circuit chip 230 by solder bumps 190 and third integrated circuit 230 is connected to package substrate 165 by solder bumps 265. This allows eight possible signal paths: A first signal path is between first integrated circuit chip 105 and pins 180 through columns 195, second integrated circuit chip 130 and third integrated circuit chip 230, a second signal path is between first integrated circuit chip 105 and pins 180 through columns 195 and third integrated circuit chip 230, a third signal path is between second integrated circuit chip 130 and pins 180 through third integrated circuit chip 230, a fourth signal path is between first integrated circuit 105 and third integrated circuit 230 through columns 195, a fifth signal path is directly between third integrated circuit chip 230 and pins 180, a sixth signal path is directly between first integrated circuit chip 105 and second integrated circuit chip 130, a seventh signal path is directly between second integrated circuit chip 130 and third integrated circuit chip 230, and an eighth signal path is between first integrated circuit chip 105 and third integrated circuit 230 through second integrated circuit 130.

Returning to FIG. 4, in stacked chip package 275 of FIG. 4, first integrated circuit chip 105 is connected to second integrated circuit chip 130 by solder bumps 185, first integrated circuit chip 105 is connected to third integrated circuit chip 280 by columns 195, first integrated circuit chip 105 is connected to package substrate 165 by columns 315, second integrated circuit chip 130 is connected to third integrated circuit chip 280 by solder bumps 190, and third integrated circuit 280 is connected to package substrate 165 by solder bumps 265. This allows nine possible signal paths: A first signal path is between first integrated circuit chip 105 and pins 180 through second integrated circuit chip 130 and third integrated circuit chip 280, a second signal path is between first integrated circuit chip 105 and pins 180 through columns 195 and third integrated circuit chip 280, a third signal path is between second integrated circuit chip 130 and pins 180 through third integrated circuit chip 280, a fourth signal path is between first integrated circuit 105 and third integrated circuit 280 through columns 195, a fifth signal path is directly between first integrated circuit chip 105 and pins 180, a sixth signal path is directly between first integrated circuit chip 105 and second integrated circuit chip 130, a seventh signal path is directly between second integrated circuit chip 130 and third integrated circuit chip 280, an eighth signal path is between first integrated circuit chip 105 and third integrated circuit 280 through second integrated circuit 130 and a ninth signal path is directly between first integrated circuit chip 105 and pins 180 through columns 315.

Figure 5A:
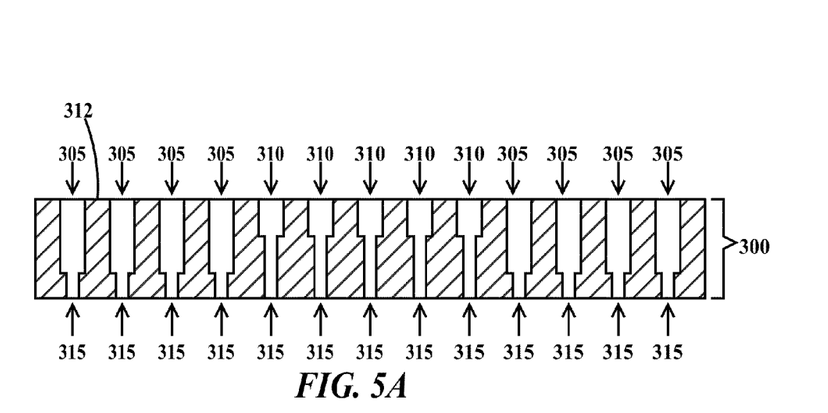
Figure 5B:
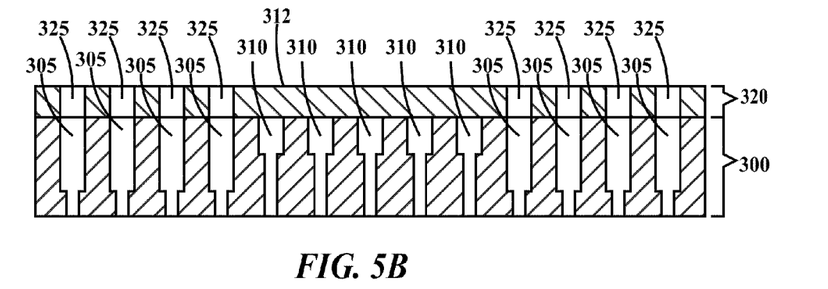
Figure 5C:
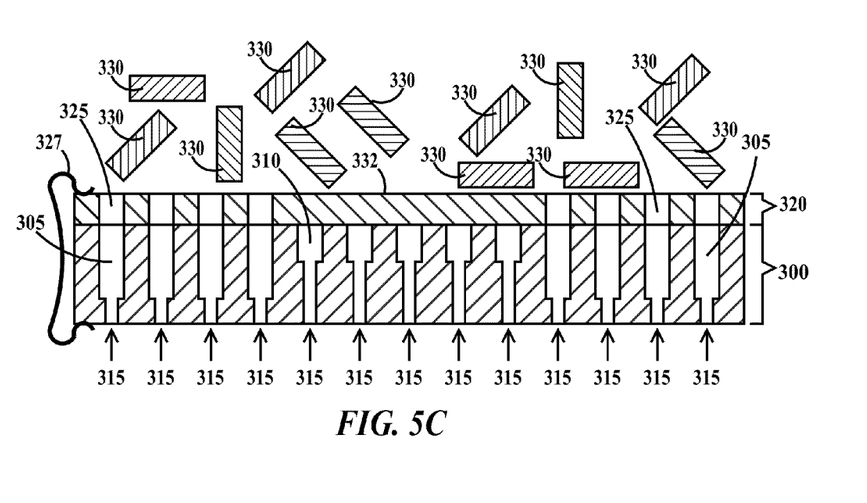
Figure 5D:
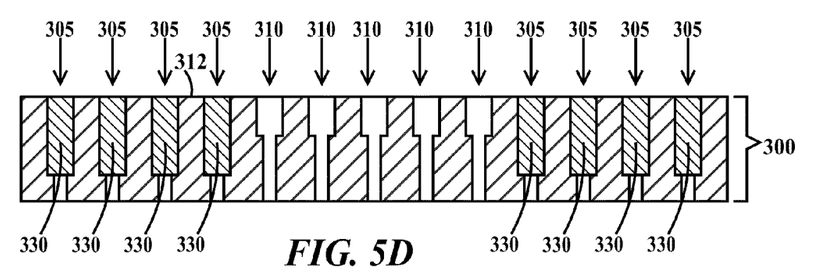
Figure 5E:
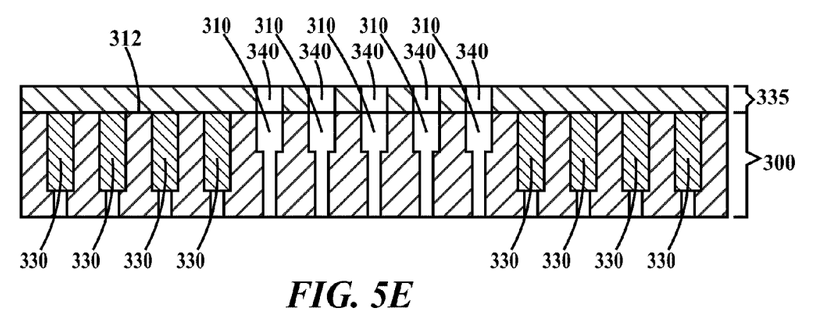
Figure 5F:
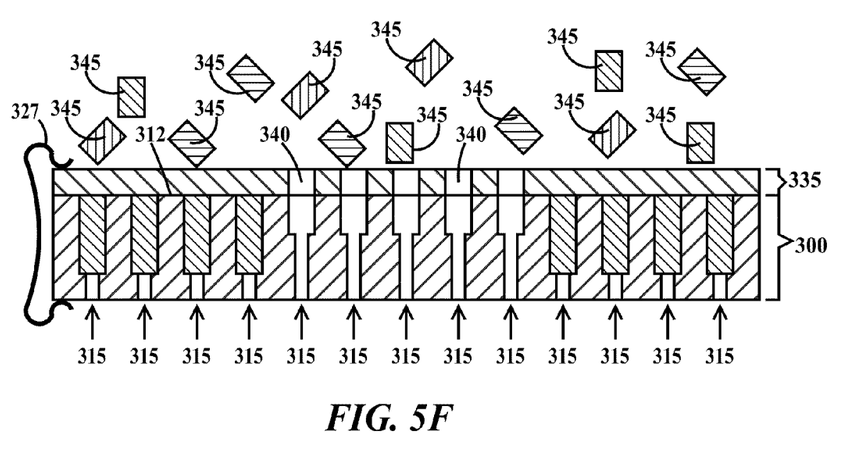
Figure 5G:
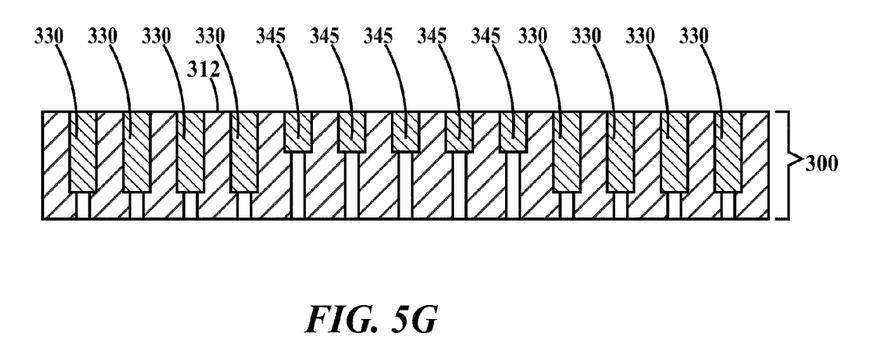
Figure 5H:
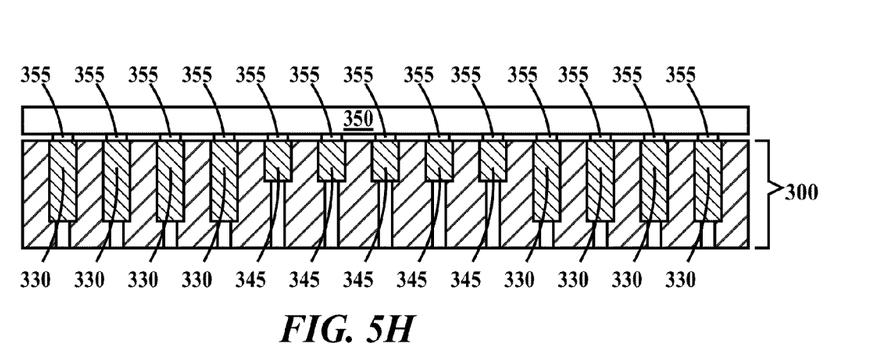

FIGS. 5A through 5L illustrate an exemplary method of fabricating a stacked integrated circuit chip package according to an embodiment of the present invention. In FIG. 5A a boat 300 includes first openings 305 and second openings 310 extending from a top surface 312 of boat 300 into but not through boat 300. Openings 305 extend further into boat 300 than opening 310 extend into boat 300. Additionally, vacuum ports 315 extend from a bottom surface of boat 300 into but not through boat 300 to the bottoms of first openings 305 and second openings 310. There is a respective vacuum port 315 open to each opening of first openings 305 and a respective vacuum port 315 open to each opening of second openings 310. A diameter (measured parallel to top surface 312) of first openings 305 is greater than a diameter (measured parallel to top surface 312) of vacuum ports 315. A diameter (measured parallel to top surface 312) of second openings 310 is greater than the diameter of vacuum ports 315. In one example, first openings 305 and second openings 310 are cylindrical. Boat 300 is fabricated from a material that is stable (will not melt, outgas, decompose or geometrically distort) at the reflow temperatures used to attach columns to an integrated circuit chip as illustrated in FIG. 5H described infra. In one example, boat 300 comprises graphite.

In FIG. 5B, a first mask 320 is aligned to boat 300. First mask 320 includes openings 325 that extend from the top surface of first mask 320 completely through first mask 320 to the bottom surface of first mask 320. First mask 320 is placed on top surface 312 of boat 300 and openings 325 are aligned to first openings 305 so first openings 305 are open to openings 325. A diameter (measured parallel to top surface 312) of openings 325 is equal to or greater than the diameter of first openings 305 so first openings 305 are completely exposed in openings 325 and second openings 310 are blocked by first mask 320. First openings 305 are not blocked by first mask 320 but second openings 310 are blocked by first mask 320. In one example, openings 325 are cylindrical.

In FIG. 5C, boat 300 and first mask 320 are clamped together using clamp 327 and a multiplicity of columns 330 are introduced on the top surface 332 of mask 320. Then a vacuum is applied to vacuum ports 315 and boat 300 is vibrated (mechanically or ultrasonically) to cause columns 330 to fall through openings 325 of first mask 320 into openings 315 as illustrated in FIG. 5D.

In FIG. 5D, first mask 320 (see FIG. 5C) is removed and each opening 305 has been filled with a column 330 and openings 310 are empty. The lengths of columns 330 are about equal to the depth of openings 305.

In FIG. 5E, a second mask 335 is aligned to boat 300. Second mask 335 includes openings 340 that extend from the top surface of second mask 335 completely through second mask 335 to the bottom surface of first mask 335. Second mask 330 is placed on top surface 312 of boat 300 and openings 340 are aligned to second openings 310 so second openings 310 are open to openings 340. A diameter (measured parallel to top surface 312) of openings 335 is equal to or greater than the diameter of second openings 310 so first openings 310 are exposed in openings 340 and first openings 305 are blocked by second mask 335. First openings 310 are not blocked by second mask 335 but first openings 305 are blocked by second mask 335. In one example, openings 340 are cylindrical.

In FIG. 5F, boat 300 and second mask 335 are clamped together using clamp 327 and a multiplicity of columns 345 are introduced on the top surface of mask 335. The lengths of columns 345 are about equal to the depth of openings 310. Then a vacuum is applied to vacuum ports 315 and boat 300 is vibrated (mechanically or ultrasonically) to cause columns 345 to fall through openings 340 of second mask 335 into openings 340 as illustrated in FIG. 5G. Second mask 335 prevents columns 330 from being expelled from first openings 305 and columns 345 entering then vacant first openings 305.

In FIG. 5G, second mask 335 (see FIG. 4F) is removed and each opening 310 is filled with a column 345 and column 330 remain in openings 305. The lengths of columns 345 are about equal to the depth of openings 310.

In FIG. 5H, an integrated circuit chip 350 having chip pads 355 is placed on boat 300 so a first subset of chip pads 355 physically contact respective tips of columns 330 and a second subset of chip pads 355 physically contact respective tips of columns 345.

Figure 5I:
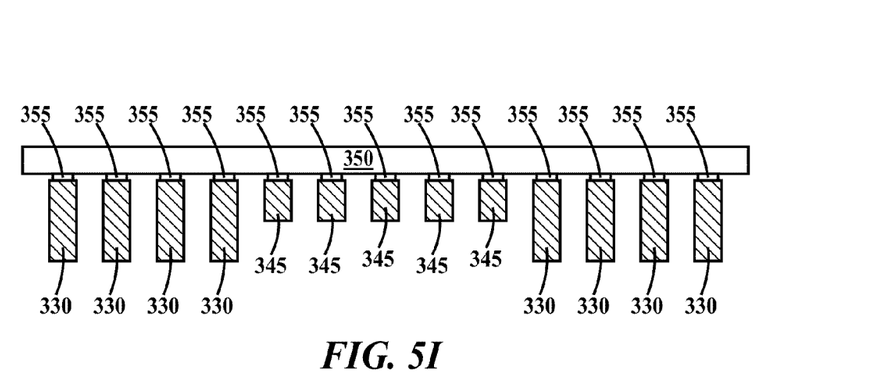

In FIG. 5I, a first reflow is performed in an inert atmosphere and at a temperature sufficient to melt the tips of columns 330 and 345 (if they are solder) to solder columns 330 and 345 to the respective chip pads 355. If columns 335 and 345 are copper then a thin layer of solder is formed on chip pads 355 and the first reflow is performed in an inert atmosphere and at a temperature and sufficient to melt the thin solder layer on chip pads 355 and wet the tips of columns 330 and 345. An inert atmosphere is an atmosphere not containing an oxidizing gas such as $O_2$ or $H_2O$. Examples of inert atmospheres include $N_2$ and a mixture of $N_2$ and $H_2$. An inert atmosphere containing $H_2$ is an example of a reducing atmosphere. In one example, flux is applied to chip pads 355 (or to the thin solder layer previously applied) prior to the first reflow. After the first reflow boat 300 (see FIG. 5H) is removed and columns 305 and 310 are solder connected to respective chip pads 355.

Figure 5J:
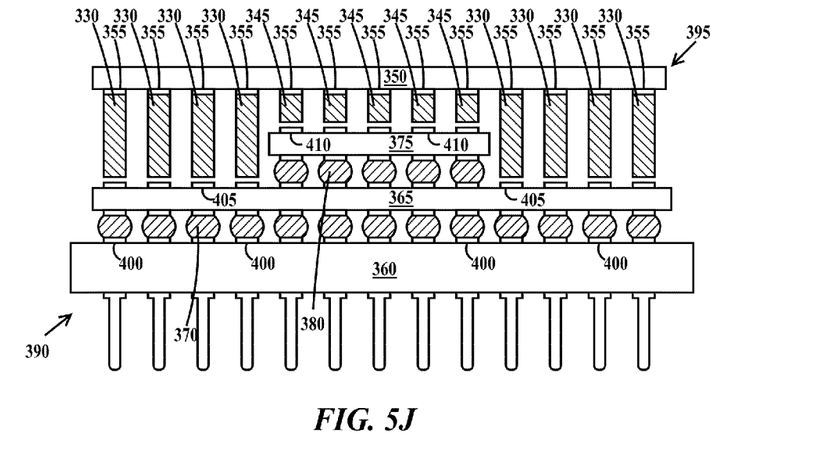

In FIG. 5J, a package substrate 360 is physically and electrically connected to an integrated circuit 365 by solder bumps 370 on package pads 400. Integrated circuit 365 is physically and electrically connected to an integrated circuit 375 by solder bumps 380. Package substrate 360 and integrated circuit chips 365 and 375 comprise a first subassembly 390. Also in FIG. 5J, solder columns 330 and 345 are physically and electrically connected to an integrated circuit chip 350 to form a second subassembly 395. Second subassembly 395 is the same structure illustrated in FIG. 5I. In FIG. 5J, second subassembly 395 is aligned over first subassembly 390 so columns 345 are over chip pads 410 of integrated circuit chip 375 and columns 330 are aligned over chip pads 405 of integrated circuit chip 365. Subassembly 395 is then lowered so columns 345 rest on chip pads 410 of integrated circuit chip 375 and columns 330 rest on chip pads 405 of integrated circuit chip 365.

Figure 5K:
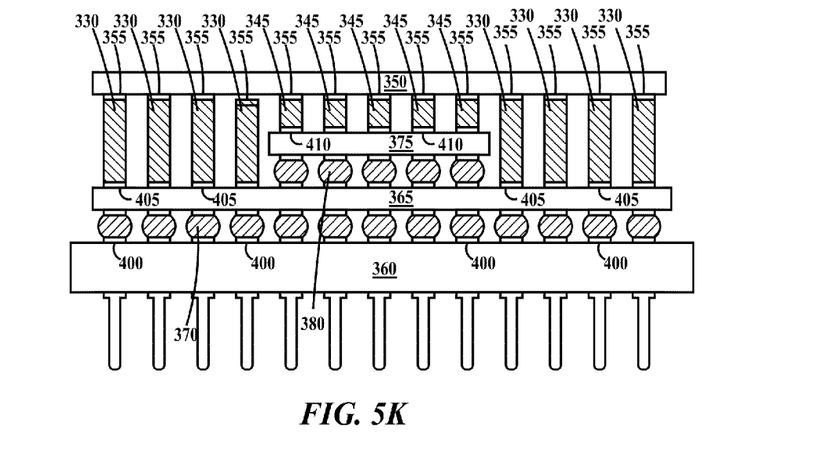

In FIG. 5K, a second reflow is performed in an inert or reducing atmosphere and at a temperature sufficient to melt the lower tips of columns 330 and 345 (if they are solder) to solder columns 330 and 345 to the respective chip pads 405 and chip pads 410. If columns 335 and 345 are copper then a thin layer of solder is formed on chip pads 405 and chip pads 410 and the second reflow is performed in an inert atmosphere and at a temperature and sufficient to melt the thin solder layer on package pads 400 and chip pads 405 and wet the lower tips of columns 330 and 345. In one example, solder bumps 370 and 380 reflow during the second reflow. In one example, solder bumps 370 and 380 do not reflow during the second reflow. Not reflowing solder bumps during the second reflow 370 and 380 may be accomplished by forming solder bumps 370 and 380 from a solder with a higher melting point than the melting point of columns 330 and 345 when columns 370 and 380 are formed from solder. Alternatively, when columns 330 and 345 are copper, not reflowing solder bumps 370 and 380 may be accomplished by forming the aforementioned thin solder layers on package pads 400 and chip pads 405 from a solder with a higher melting point than the melting point of solder bumps 370 and 380. After the second reflow, a first subset of chip pads 355 are physically and electrically connected to columns 330 and a second subset of chip pads 355 are physically and electrically connected to columns 345. Solder bumps 380 still physically and electrically connect integrated circuit chip 375 to integrated circuit chip 365, solder bumps 370 still physically and electrically connect integrated circuit chip 365 to package substrate 360.

In one example, the first reflow and the second reflow are performed at the same temperature. In one example, the first reflow is performed at a higher temperature than the second reflow and solder bumps 370 and 380 melt at a higher temperature than solder columns 330 and 345.

Figure 5L:
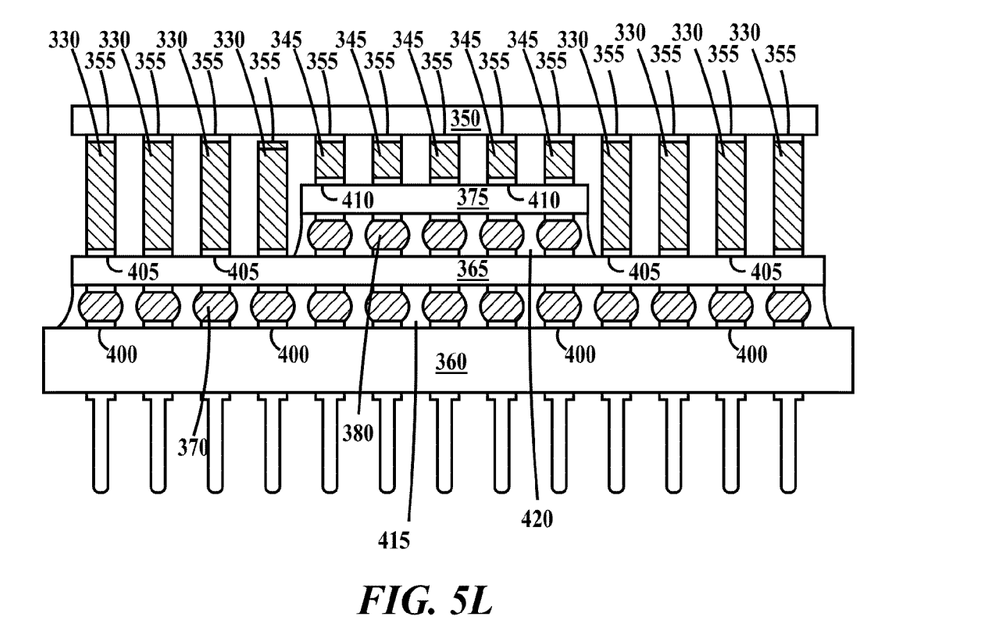

In FIG. 5L, an underfill 415 is formed between package substrate 360 and integrated circuit chip 365 and an underfill 415 is formed between integrated circuit chip 365 and integrated circuit chip 375. In one example, underfills 415 and 420 comprises silica filled epoxy resin. A lid or a lid and heatsink may then be placed over the structure of FIG. 5L as in FIG. 3 described supra.

The method of FIGS. 5A through 5L is exemplary and uses fabrication of stacked chip package 225A of FIG. 3 as an example. The method may be modified to fabricate stacked chip package 100 of FIG. 1, stacked chip package 225 of FIG. 2, stacked chip package 275 of FIG. 4 and other stacked chips by varying the number of openings, the position of openings, the number of different depth openings and the masks used in FIGS. 5A through 5I.

Thus, the embodiments of the present invention provide for a stacked integrated circuit chip package that sends a first group of signals from an first integrated circuit chip to a package substrate through an intervening integrated circuit chip having through wafer vias and sends a second group of signals from the first integrated circuit chip to the package substrate directly or indirectly through electrically conductive columns external to the integrated circuit chips to reduce the propagation delay, signal loss, and signal noise of the second signals.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
providing a boat having first openings extending a first depth into said boat and second openings extending a second and different depth into said boat;
placing a first mask on said boat, first through openings of said first mask aligned to said first openings, said first mask blocking said second openings and then placing first columns into said first openings through said first through openings followed by removing said first mask;
placing a second mask on said boat, second through openings of said second mask aligned to said second openings, said second mask blocking said first openings and then placing second columns into said second openings through said second through openings followed by removing said second mask; and
placing an integrated circuit chip on said boat and attaching exposed upper ends of said first and second columns to respective chip pads of said integrated circuit using a solder reflow process and then removing said boat.

2. The method of claim 1, further including:
applying a vacuum to a bottom of first and second openings while placing said first columns into said first openings; and
applying a vacuum to a bottom of first and second openings while placing said second columns into said second openings.

3. The method of claim 1, wherein said columns are solder columns and said solder reflow process reflows said upper ends of solder columns in an inert atmosphere.

4. The method of claim 1, wherein said columns are copper and further including:

forming a solder layer on said chip pads of said integrated circuit chip; and said solder reflow process reflowing said solder layer in an inert atmosphere.

5. The method of claim 1, further including:

providing a stack comprising a first additional integrated circuit chip mounted on a second additional integrated circuit and said second additional integrated circuited mounted on a package substrate; and after removing said boat, simultaneously attaching respective chip pads of said first additional second integrated circuit to lower ends of said first columns and attaching respective chip pads of said second additional integrated circuit to lower ends of said second columns using an additional reflow process.

6. The method of claim 5 wherein a temperature of said additional reflow process is less than a melting point of said first and said second solder bumps.

7. The method of claim 5, wherein said first additional integrated circuit is physically and electrically connected to said second additional integrated circuit by first solder bumps and said second additional integrated circuit chip is physically and electrically connected to a package substrate by second solder bumps.

8. The method of claim 7, wherein said first solder bumps are connected to backside chip pads contacting through wafer vias formed in said first additional integrated circuit chip and wherein said second solder bumps are connected to backside chip pads contacting through wafer vias formed in said second additional integrated circuit chip.

9. The method of claim 1, further including:

providing a stack comprising a first additional integrated circuit chip mounted on a second additional integrated circuit and said second additional integrated circuited mounted on a package substrate; and after removing said boat, simultaneously attaching respective chip pads of said second additional integrated circuit to lower ends of said first columns, attaching respective package pads of said package substrate to lower ends of said second columns and attaching said first solder bumps of said integrated circuit chip to respective chip pads of said first additional integrated circuit using an additional reflow process.

10. The method of claim 9 wherein a temperature of said additional reflow process is less than a melting point of said first solder bumps and said second solder bumps.

11. The method of claim 9, wherein said first additional integrated circuit is physically and electrically connected to said second additional integrated circuit by second solder bumps, said second additional integrated circuit chip is physically and electrically connected to said package substrate by third solder bumps.

12. The method of claim 11, wherein said second solder bumps are electrically connected to backside pads contacting through wafer vias formed in said first additional integrated circuit chip and wherein said third solder bumps are electrically connected to backside pads contacting through wafer vias formed in said second additional integrated circuit chip.

* * * * *